United States Patent
Wake

(10) Patent No.: US 6,867,139 B2
(45) Date of Patent: Mar. 15, 2005

(54) METHOD OF MANUFACTURING SEMICONDUCTOR DEVICE

(75) Inventor: Tomoko Wake, Tokyo (JP)

(73) Assignee: NEC Corporation, Tokyo (JP)

( * ) Notice: Subject to any disclaimer, the term of this patent is extended or adjusted under 35 U.S.C. 154(b) by 24 days.

(21) Appl. No.: 10/164,130

(22) Filed: Jun. 5, 2002

(65) Prior Publication Data

US 2002/0187640 A1 Dec. 12, 2002

(30) Foreign Application Priority Data

Jun. 6, 2001 (JP) .................................... 2001-171812

(51) Int. Cl.⁷ ............................................ H01L 21/302
(52) U.S. Cl. ...................... 438/692; 438/694; 438/696; 438/699; 438/700
(58) Field of Search ............................... 438/692, 694, 438/696, 699, 700

(56) References Cited

U.S. PATENT DOCUMENTS 6,123,088 A * 9/2000 Ho ............................. 134/1.3
6,509,273 B1 * 1/2003 Imai et al. ................... 438/693
6,579,153 B2 * 6/2003 Uchikura et al. ............. 451/41

FOREIGN PATENT DOCUMENTS

JP      2000-068272      3/2000
JP      2000-277612      10/2000

* cited by examiner

Primary Examiner—Nadine G. Norton
Assistant Examiner—Binh X. Tran
(74) Attorney, Agent, or Firm—Michael Best & Friedrich LLP

(57) ABSTRACT

A semiconductor device manufacturing method wherein a via-hole is formed in an second inter-layer insulating film covering a lower layer wiring, throughout a surface of which are then formed a barrier film made of Ta (tantalum) and a Cu (copper) film sequentially, after which, first an unnecessary part of the Cu film is removed by a CMP (Chemical Mechanical Polishing) method using such a polishing liquid to which hydrogen peroxide is added by 1.5 weight-percent or more (first polishing step) and then an unnecessary part of the barrier film is removed by a CMP method for using a polishing liquid to which hydrogen peroxide is added by 0.09–1.5 weight-percent and applying a pressure of 4–10 Psi (pounds per square inch) on the barrier film (second polishing step).

13 Claims, 12 Drawing Sheets

5; wiring trench

5; wiring trench    6; barrier film

19; Cu film

FIG. 10A *(Prior Art)*
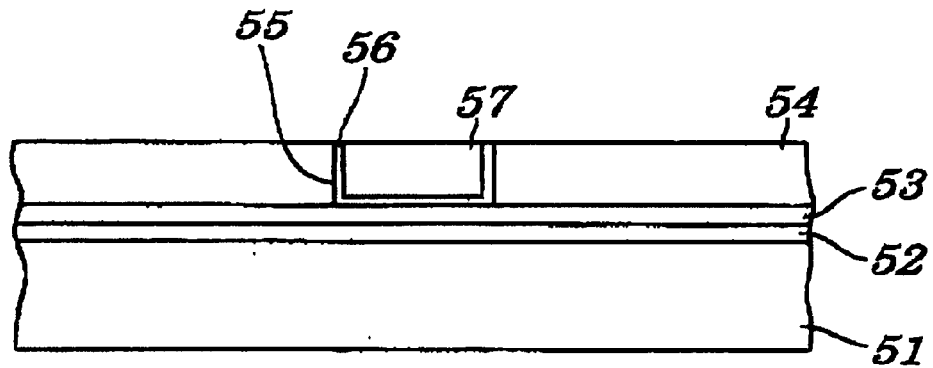
FIG. 10B *(Prior Art)*
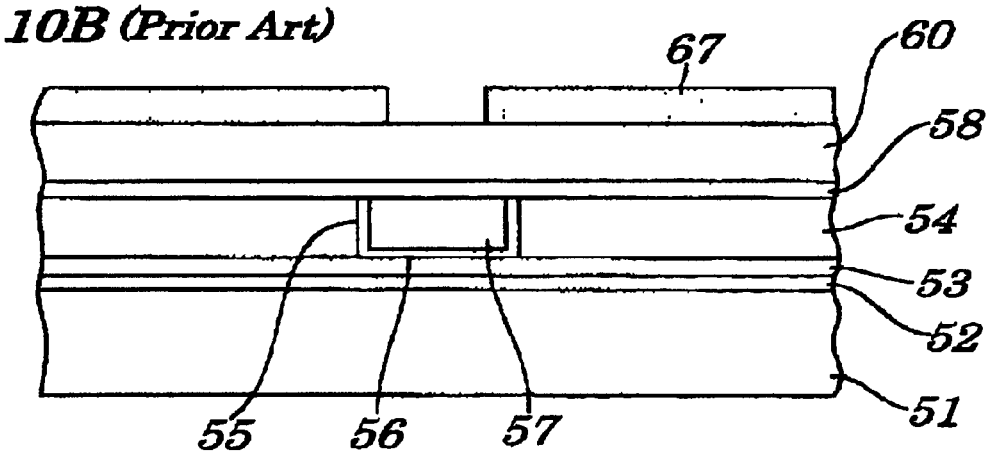
FIG. 10C *(Prior Art)*
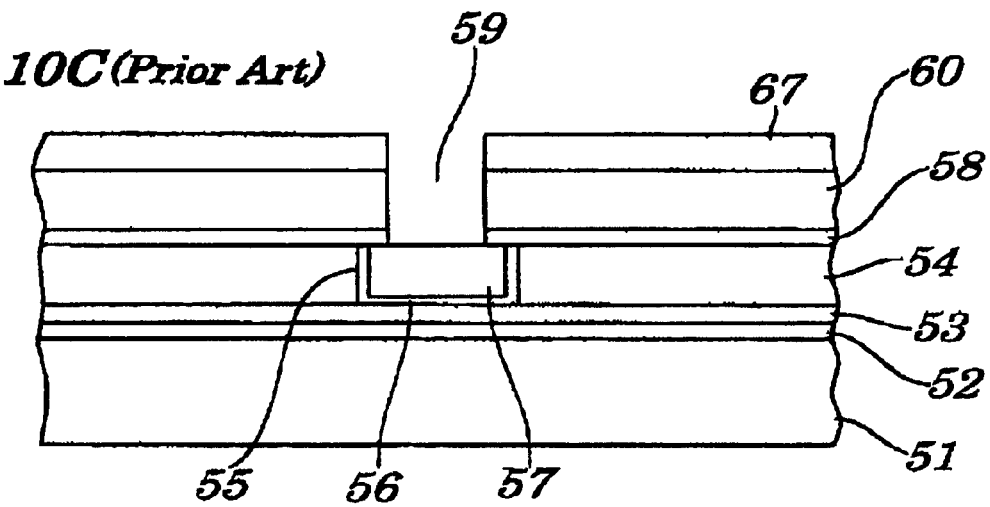

METHOD OF MANUFACTURING SEMICONDUCTOR DEVICE

BACKGROUND OF THE PRESENT INVENTION

1. Field of the Present Invention

The present invention relates to a method of manufacturing a semiconductor device and, more particularly, to a method of manufacturing a semiconductor device, utilizing CMP (Chemical Mechanical Polishing) to thereby form in two polishing steps a via-plug in an inter-layer insulating film for interconnecting an upper layer wiring and a lower layer wiring.

The present application claims priority of Japanese Patent Application No.2001-171812 filed on Jun. 6, 2001, which is hereby incorporated by reference.

2. Description of the Related Art

An LSI (Large Scale Integration) such as a microprocessor or a memory known as a representative of a semiconductor device has been more and more fine-patterned in size of individual elements thereof with an improvement in integration density, which is accompanied by finer patterning of a semiconductor region of each of the elements. Also, in formation of a wiring to connect such semiconductor regions, if the wiring is formed only in a plane direction of a semiconductor substrate, a wiring density cannot be high, to solve such problem a multi-layer wiring technology has been developed for forming the wiring also in a thickness direction through a plurality of layers.

In such the LSI, a resistance of the wiring has a significant effect on characteristics such as an operating speed, so that the wiring is desired to be low in resistance. Conventionally, as a material of the wiring in semiconductor devices including an LSI, aluminum (Al) or an Al-based metal made of Al mainly has generally been used because of their good electrical characteristics, processibility, and a like. The Al-based metals, however, have an disadvantage of poor electro-migration resistance, stress-migration resistance, and a like. To solve this problem, rather than the Al-based metals, copper (Cu) or a Cu-based metal made of Cu mainly is employed presently because of their excellence in electro-migration resistance, stress-migration resistance, and the like.

The Cu-based metal, however, is stable chemically when it is formed as a film, so that a Cu-based metal film, once formed, cannot easily be patterned into a desired shape of a wiring by etching as compared to an Al-based metal film. To solve this problem, a so-called Damascene wiring technology is employed, whereby when forming a wiring using a Cu-based metal, a wiring trench is formed beforehand in an interlayer insulating film formed on a semiconductor substrate, then a Cu-based metal film is formed all over the surface including this wiring trench, and then an unnecessary part of this Cu-based metal film on the inter-layer insulating film is removed by CMP, thus providing the wiring made of the Cu-based metal film which is left (embedded) only in the wiring trench.

A semiconductor device having a multi-layer wiring construction formed by this Damascene wiring technology is disclosed, for example, in Japanese Patent Application Laid-open No. 2000-277612. To manufacture this semiconductor device, as shown in FIG. 9, a first inter-layer insulating film 54 made of silicon oxide ($SiO_2$) or a like is formed on a semiconductor substrate 51 via an insulating film 52 made of silicon oxide or the like and an etching stopper film 53 made of silicon nitride (SiN), in a wiring trench 55 in which first inter-layer insulating film 54 is formed a lower layer wiring 57 (first layer wiring) made of a Cu film as embedded therein via a barrier film 56. Also, on the first inter-layer insulating film 54 is formed via an etching stopper film 58, a second inter-layer insulating film 60, in a wiring trench (via-hole 59 in this case) in which the second inter-layer insulating film 60 is formed via a barrier film 61 a conductive plug (via-plug 63) made of a Cu film. Further, on the second inter-layer insulating film 60 is formed via a barrier film 64 an upper layer wiring 65 (second layer wiring) made of a Cu film. In this configuration, the barrier films 56, 64, and a like serve as a diffusion preventing film for preventing Cu from diffusing downward.

As can be seen from the above, in the conventional semiconductor device shown in FIG. 9, in the via-hole 59 in the second inter-layer insulating film 60 covering the lower layer wiring 57 made of the Cu film is formed the via-plug 63 made of the Cu film by the Damascene wiring technology, thus interconnecting the lower layer wiring (first layer wiring) 57 and the upper layer wiring (second layer wiring) 65. Although in this conventional example, the lower layer wiring (first layer wiring) 57 and the upper layer wiring (second layer wiring) 65 are interconnected through the via-plug 63, further a third layer and subsequent ones of wirings may be formed vertically and interconnected through a via-plug in some cases. In some microprocessors representative of an LSI, a multi-layer wiring construction is implemented including up to eight or nine layers.

To manufacture a semiconductor device having the multi-layer wiring construction using the above-mentioned Damascene wiring technology, the following method utilizing CMP is employed. This method is described below along the steps thereof with reference to FIGS. 10A–10D.

First, as shown in FIG. 10A, the semiconductor substrate 51 is prepared on a surface of which are formed the insulating film 52 made of silicon oxide or the like, the etching stopper film 53 made of silicon nitride or a like, and the first inter-layer insulating film 54 made of silicon oxide or the like sequentially. Next, a known photolithographic method is utilized to thereby form the wiring trench 55 in the first inter-layer insulating film 54, in which wiring trench 55 is then embedded a Cu film via the barrier film 56 made of tantalum (Ta) to thereby form the lower layer wiring 57. To form this lower layer wiring 57, specifically the Ta film and the Cu film are formed sequentially throughout the surface including the wiring trench 55 after this wiring trench 55 is formed in the first inter-layer insulating film 54 beforehand, then an unnecessary part of the Cu film on the first inter-layer insulating film 54 is removed by CMP until the Ta film is exposed, and then an unnecessary part of the Ta film on the first inter-layer insulating film 54 is removed similarly by CMP, thus leaving the Cu film only in the wiring trench 55 via the barrier film 56. Next, as shown in FIG. 10B, the second inter-layer insulating film 60 made of silicon oxide is formed throughout the surface via the etching stopper film 58 made of silicon nitride, on which second inter-layer insulating film 60 is formed a photo-resist film 67 except in a region in which the via-hole 59 is to be formed.

Next, as shown in FIG. 10C, using the photo-resist film 67 as a mask, the second inter-layer insulating film 60 and the etching stopper film 58 are etched sequentially to form the via-hole 59, through which the lower layer wiring 57 is to be exposed.

Next, as shown in FIG. 10D, the photo-resist film 67 is removed, then the barrier film 61 made of Ta is formed by sputtering throughout the surface including the via-hole 59, and then a Cu film 70 is formed by plating throughout the surface. Specifically, however, a seed film (not shown) for plating purpose made of a thin Cu film is formed beforehand by sputtering on the barrier film 61 and then Cu is plated onto this plating seed film.

Next, as shown in FIG. 10E, to form the via-plug in the second inter-layer insulating film 60, first an unnecessary part of the Cu film 70 on the second inter-layer insulating film 60 is removed by CMP until the barrier film 61 is exposed (first polishing step). At this first polishing step, CMP is carried out under such conditions that the Cu film 70 may have a higher polishing rate than the barrier film 61.

Next, as shown in FIG. 10F, the barrier film 61 on the second inter-layer insulating film 60 is removed by CMP to leave the Cu film 70 only in the via-hole 59, thus forming the via-plug 63 (second polishing step). At this second polishing step, CMP has conventionally been carried out under such conditions that a polishing liquid employed may have an addition of about 1.5 weight-percent or more of, in particular, hydrogen peroxide ($H_2O_2$), which is an oxidizing agent. This CMP method has also been carried out under such conditions that a pressure of about 4 Psi (Pounds per square inch) or less may be applied on the barrier film 61. Conventionally, such setting of the quantity of a hydrogen peroxide added (that is, concentration) has been considered to be preferably because it reduces the frictional force on the barrier film 61 during CMP. Also, such setting of the pressure has been considered preferably because it relaxes polishing of the barrier film 61.

Next, the upper layer wiring 65 (second layer wiring) made of the Cu film is formed on the second inter-layer insulating film 60 via the barrier film 64, thus completing a semiconductor device having such a multi-layer wiring construction as shown in FIG. 9.

The conventional semiconductor device manufacturing method, however, has the following problem in the second polishing step for forming the via-plug 63 using CMP.

First, by this semiconductor device manufacturing method, in the second step for forming the via-plug 63 which interconnects the lower layer wiring 57 and the upper layer wiring 65, as mentioned above, about 1.5 weight-percent or more of hydrogen peroxide is added to the polishing liquid employed in CMP, thus taking long time to polish the barrier film 61. That is, by using such a polishing liquid in CMP, as mentioned above, the frictional force on the barrier film 61 can be reduced to thereby give an advantage of uniform polishing of the barrier film 61, which, however, gives rise to such a problem that the polishing rate of the barrier film 61 is decreased to thereby take long time in polishing, thus deteriorating throughput.

Also, by the conventional semiconductor device manufacturing method, in the second polishing step for forming the via-plug 63 which interconnects the lower layer wiring 57 and the upper layer wiring 65, the CMP processing of the barrier film 61 involves application of a pressure of about 4 Psi on the barrier film 61 on the second inter-layer insulating film 60, so that peripheral portions of the semiconductor device, which have a large step, has a residue of the barrier film 64 thereon, thus giving rise to a problem of poor surface uniformity.

That is, as shown in FIG. 11, generally when an insulating film or a conductive film is stacked repeatedly on the semiconductor substrate 51, a step is inevitably formed particularly at a peripheral portion 51A of the semiconductor substrate 51 as shown in FIG. 12. Therefore, if the pressure is set at about 4 Psi to relax polishing as mentioned above, the polishing rate of the barrier film 61 is decreased, so that the barrier film 61 is liable to be left at the peripheral portion 51A even after CMP is carried out thereon, thus deteriorating the surface uniformity. Such a residue of the barrier film 64 may give poor close contact between the second inter-layer insulating film 60 and any other insulating film such as an etching stopper film 58, if formed thereon in the post-processing, thus easily giving rise to peel-off of the other insulating film.

Further, by the conventional semiconductor device manufacturing method, in the second polishing step for forming the via-plug 63 which interconnects the lower layer wiring 57 and the upper layer wiring 65, the CMP processing of the barrier film 61 generates a recess in the via-plug 63, thus giving rise to a problem of open circuiting of a via-chain.

That is, as compared to a density of wirings 73 such as the lower layer or upper layer wiring formed on the semiconductor substrate 51 as shown in FIG. 13A, that of the via-plugs 63 formed therein is small by one digit or more as shown in FIG. 13B The CMP abrasive liquid, therefore, is concentrated at an exposed portion of the via-plugs 63 formed as rather isolated, so that they are etched off in a concentrated manner as shown in FIG. 14, thus forming a recess 69 therein. As such, the via-plugs 63 fail to connect to the upper layer wiring, so that the upper layer and lower layer wirings are nonconductive to each other, thus suffering from open-circuiting therebetween. Also, the recess 69 is clogged with abrasive grain contained in the polishing liquid to resultantly give poor contact between the upper layer and lower layer wirings, thus giving open-circuiting therebetween similarly.

SUMMARY OF THE INVENTION

In view of the above, it is an object of the present invention to provide a method of manufacturing a semiconductor device which can increase a rate of polishing a barrier film when forming, by CMP, a via-plug which interconnects upper layer and lower layer wirings in an inter-layer insulating film through the barrier film, to improve throughput as well as surface uniformity and also prevent occurrence of a problem of via-chain open-circuiting of the via-plugs.

According to a first aspect of the present invention, there is provided a method of manufacturing a semiconductor device in such a manner of forming an upper layer wiring on an inter-layer insulating film covering a lower layer wiring, forming a via-plug in a via-hole formed in the inter-layer insulating film, and interconnecting the lower layer wiring and the upper layer wiring through the via-plug, including:

a via-hole forming step for forming the via-hole in the inter-layer insulating film in such a manner as to expose the lower layer wiring;

a barrier film forming step for forming a barrier film throughout a surface including the via-hole;

a conductive film forming step for forming a conductive film on the barrier film;

a first polishing step for polishing and removing the conductive film on the barrier film until the barrier film is exposed by a CMP method using such a polishing liquid that the conductive film may have a higher polishing rate than the barrier film; and a second polishing step for removing the barrier film on the inter-layer insulating film by a CMP method using such a polishing liquid that the conductive film may have a lower polishing rate than the barrier film, to leave the conductive film as non-removed only in the via-hole via the barrier film, thus forming the via-plug.

In the foregoing, a preferable mode is one wherein the second polishing step is performed with a pressure of 4–10 Psi applied on the barrier film on the inter-layer insulating film.

Another preferable mode is one wherein the second polishing step is followed by an upper layer wiring forming step for forming the upper layer wiring on the inter-layer insulating film in such a manner that the upper layer wiring may connect to the via-plug.

Still another preferable mode is one wherein the barrier film is made of tantalum-based metal and the conductive film is made of copper-based metal.

An additional preferable mode is one wherein the lower layer wiring and the upper layer wiring are made of copper-based metal.

According to a second aspect of the present invention, there is provided a method of manufacturing a semiconductor device in such a manner of forming an upper layer wiring on an inter-layer insulating film covering a lower layer wiring, forming a via-plug in a via-hole formed in the inter-layer insulating film, and interconnecting the lower layer wiring and the upper layer wiring through the via-plug, including:

a via-hole forming step for forming the via-hole in the inter-layer insulating film in such a manner as to expose the lower layer wiring;

a barrier film forming step for forming a barrier film throughout a surface including the via-hole;

a conductive film forming step for forming a conductive film on the barrier film;

a first polishing step for polishing and removing the conductive film on the barrier film until the barrier film is exposed by a CMP method using a polishing liquid to which hydrogen peroxide is added by 1.5 weight-percent; and a second polishing step for removing the barrier film on the inter-layer insulating film by a CMP method using a polishing liquid to which hydrogen peroxide is added by 0.09–1.5 weight-percent, to leave the conductive film as non-removed only in the via-hole via the barrier film, thus forming the via-plug.

According to a third aspect of the present invention, there is provided a method of manufacturing a semiconductor device in such a manner of forming an upper layer wiring on an inter-layer insulating film covering a lower layer wiring, forming a via-plug in a via-hole formed in the inter-layer insulating film, and interconnecting the lower layer wiring and the upper layer wiring through the via-plug, including:

a via-hole forming step for forming the via-hole in the inter-layer insulating film in such a manner as to expose the lower layer wiring;

a barrier film forming step for forming a barrier film throughout a surface including the via-hole;

a conductive film forming step for forming a conductive film on the barrier film;

a first polishing step for polishing and removing the conductive film on the barrier film until the barrier film is exposed by a CMP method using a polishing liquid to which hydrogen peroxide is added by 1.5 weight-percent or more; and a second polishing step for removing the barrier film on the inter-layer insulating film by a CMP method using a polishing liquid containing no hydrogen peroxide, to leave the conductive film as non-removed only in the via-hole via the barrier film, thus forming the via-plug.

According to a fourth aspect of the present invention, there is provided a method of manufacturing a semiconductor device in such a manner of forming a wiring trench in an insulating film covering a surface of a semiconductor substrate, then forming a barrier film and a conductive film sequentially throughout the surface including the wiring trench, and then sequentially polishing the conductive film and the barrier film exposed above the surface of the wiring trench utilizing a CMP method to thereby form an embedded wiring, including:

a first CMP step for polishing and removing the conductive film exposed above the surface of the wiring trench; and a second CMP step for removing the barrier film exposed above the surface of the wiring trench by using a polishing liquid to which hydrogen peroxide is added by 0.09–1.5 weight-percent, to leave the conductive film as non-removed only in the wiring trench via the barrier film, thus forming the embedded wiring.

In the fourth aspect, a preferable mode is one wherein the second CMP step is performed with a pressure of 4–10 Psi applied on the barrier film exposed above the surface of the wiring trench.

Another preferable mode is one wherein the barrier film is made of tantalum-based metal and the conductive film is made of copper-based metal.

With the above configurations, to form in an inter-layer insulating film a via-plug which interconnects lower layer and upper layer wirings, the via-hole is formed in the inter-layer insulating film covering the lower layer wiring, throughout the surface of which are then formed a barrier film and a conductive film sequentially, after which, first the conductive film on the barrier film is polished and removed (first polishing step) until the barrier film is exposed by a CMP method using such a polishing liquid that the conductive film may have a higher polishing rate than the barrier film and then the barrier film on the inter-layer insulating film is removed by a CMP method using such a polishing liquid that the conductive film may have a lower polishing rate than the barrier film, to thereby leave the conductive film non-removed only in the via-hole via the barrier film, thus forming the via-plug easily.

Therefore, to form in the inter-layer insulating film the via-plug which interconnects the lower layer and the upper layer wirings via the barrier film by utilizing the CMP method, the polishing rate of the barrier film can be increased to thereby improve throughput as well as the surface uniformity and also prevent occurrence of open-circuiting of a via-chain of the via-plugs.

BRIEF DESCRIPTION OF THE DRAWINGS

The above and other objects, advantages, and features of the present invention will be more apparent from the following description taken in conjunction with the accompanying drawings, in which:

FIGS. 10A to 10C are process diagrams for sequentially showing steps of a method for manufacturing the conventional semiconductor device;

DESCRIPTION OF THE PREFERRED EMBODIMENTS

Best mode of carrying out the present invention will be described in further detail using various embodiments with reference to the accompanying drawings. The description is made specifically using the embodiments.

FIRST EMBODIMENT

The following will describe a semiconductor device manufacturing method according to the first embodiment with reference to FIGS. 1A–1F and 2.

Figure 1A:
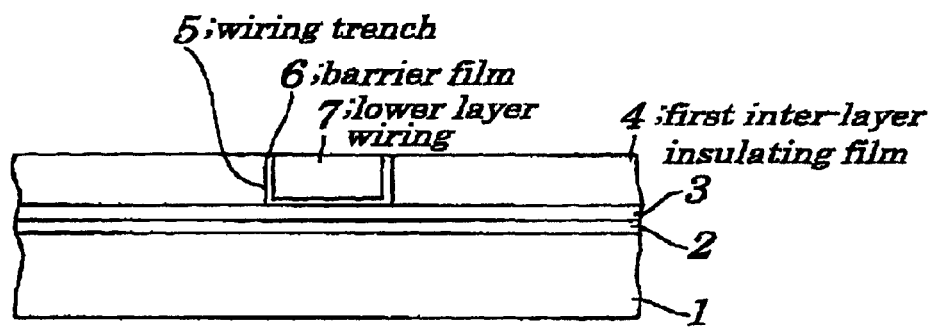
FIGS. 1A to 1C are process diagrams for sequentially showing steps of a semiconductor device manufacturing method according to a first embodiment of the present invention.

First, as shown in FIG. 1A, a semiconductor substrate 1 made of silicon or a like is prepared on which are formed an insulating film 2 made of silicon oxide or a like, an etching stopper film 3 made of silicon nitride or a like, and a first inter-layer insulating film 4 made of silicon oxide or a like sequentially. Then, a known photolithographic technology is utilized to form the wiring trench 5 in the first inter-layer insulating film 4 by etching, into which the wiring trench 5 is embedded Cu (copper) via a barrier film 6 made of Ta (tantalum) to thereby form a lower layer wiring 7. To form this lower layer wiring 7, specifically the wiring trench 5 is formed in the first inter-layer insulating film 4 beforehand, so that subsequently, throughout a surface including the wiring trench 5 are formed a Ta film and a Cu film sequentially by sputtering or a like; then, first an unnecessary part of the Cu film on the first inter-layer insulating film 4 is removed by a CMP method until the Ta film is exposed and then, by the similar CMP method, an unnecessary part of the Ta film on the first inter-layer insulating film 4 is removed so as to leave the Cu film only in the wiring trench 5 via the barrier film 6 made up only the Ta film.

Figure 1B:
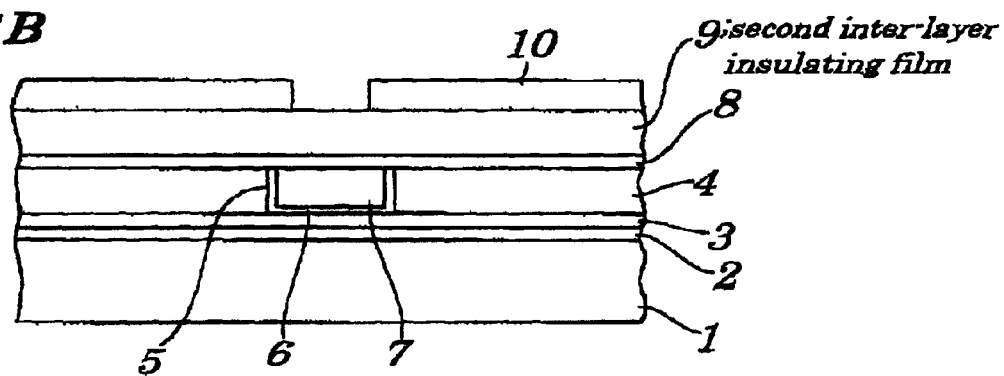

Next, as shown in FIG. 1B, a second inter-layer insulating film 9 made of silicon oxide is formed to a film thickness of 300–400 nm via an etching stopper film 8 made of silicon nitride formed to a film thickness of 45–55 nm throughout the surface utilizing CVD, on which second inter-layer insulating film 9 is then formed a photo-resist film 10 except on a region where a via-hole 11 is to be formed.

Figure 1C:
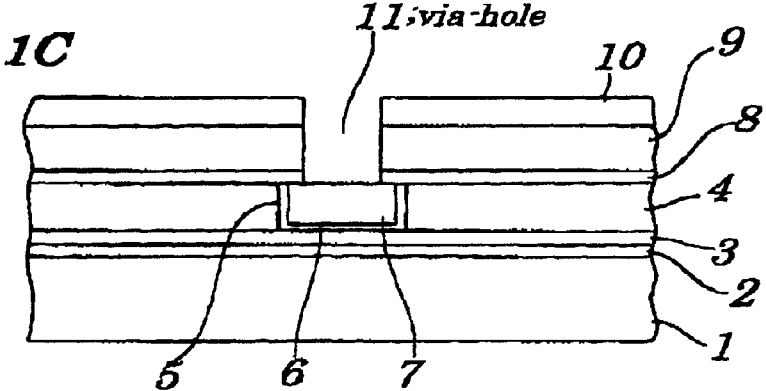

Next, as shown in FIG. 1C, using the photo-resist film 10 as a mask, the second inter-layer insulating film 9 and the etching stopper film 8 are dry-etched sequentially to thereby form the via-hole 11 made of Cu, through which the lower layer wiring 7 is exposed. To form this via-hole 11, specifically using the photo-resist film 7 as a mask the etching stopper film 8 is exposed by dry-etching only the second inter-layer insulating film 9 under such dry-etching conditions that the second inter-layer insulating film 9 may have a larger selective etching ratio than the etching stopper film 8, then the photo-resist film 10 is removed, and then the second inter-layer insulating film 9 is used to dry-etch only the etching stopper film 8 under such dry-etching conditions that the etching stopper film 8 may have a larger selective etching ratio than the second inter-layer insulating film 9, thus forming the via-hole 11.

Figure 1D:
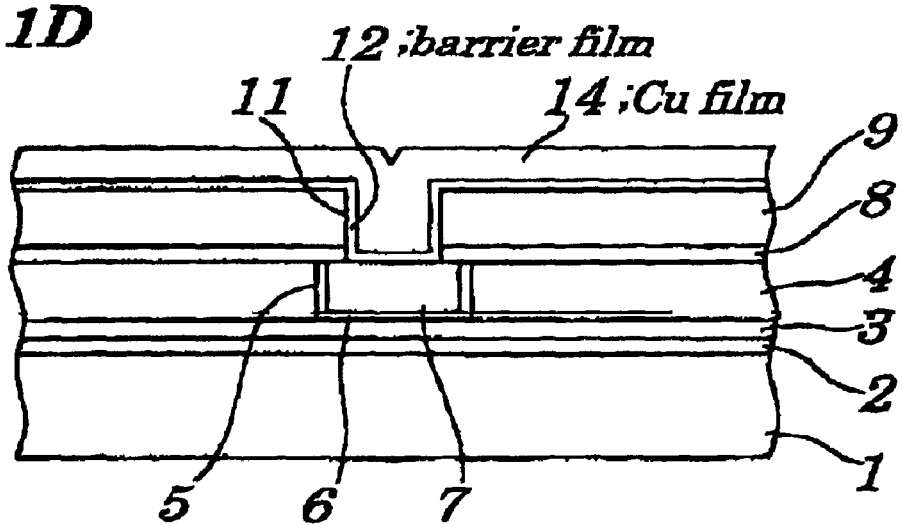
FIGS. 1D to 1F are process diagrams for sequentially showing the continuing steps of the semiconductor device manufacturing method according to the first embodiment.

Next, as shown in FIG. 1D, a barrier film 12 made of Ta is formed to a film thickness of 5–10 nm by sputtering throughout the surface including the via-hole 11, on which is then formed a plating seed film (not shown) made of Cu to a film thickness of 80–100 nm throughout the surface by sputtering, which plating seed film is then used as a plating electrode to form a Cu film 14 to a film thickness of 250–350 nm throughout the surface by electroplating. Then, the semiconductor substrate 1 is annealed in an inactive atmosphere including nitrogen or a like at a temperature of 250–400° C. for 25–30 minutes, thus stabilizing crystal structure of the Cu film 14.

Figure 1E:
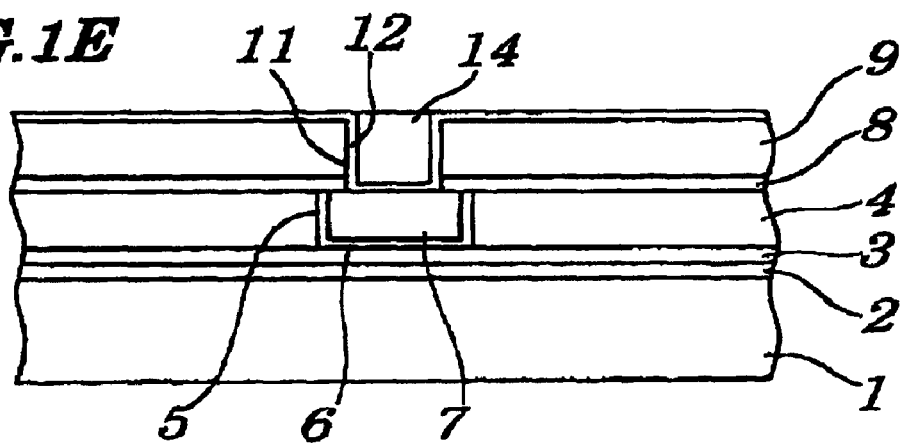
Figure 4:
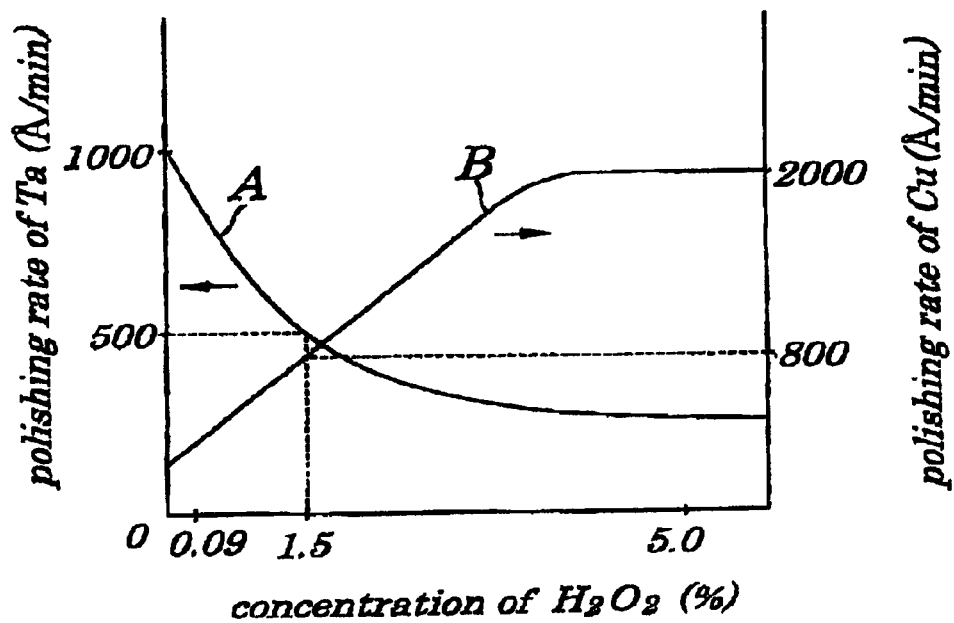
FIG. 4 is a graph for showing a relationship among a concentration of hydrogen peroxide contained in a polishing liquid used in the semiconductor device manufacturing method according to the first embodiment (horizontal axis), a Ta polishing rate (left vertical axis), and a Cu polishing rate (right vertical axis)

Next, as shown in FIG. 1E, to form a via-plug in the second inter-layer insulating film 9, first an unnecessary part of the Cu film 14 on the barrier film 12 on the second inter-layer insulating film 9 is removed by CMP (first polishing step). This first polishing step is carried out under such CMP conditions that the Cu film 14 may have a higher polishing rate than the barrier film 12. Specifically, a polishing liquid having such characteristics as shown in FIG. 4 is employed. In FIG. 4, curve A indicates the characteristics of the barrier film 12 made of Ta and curve B, those of the Cu film 14. Polishing of the unnecessary part of the Cu film 14 is stopped immediately when the underlying barrier film 12 is exposed. A progressing situation of this polishing processing can be detected optically by, for example, monitoring light reflectivity of the Cu film 14 because light reflectivity changes at a moment when the barrier film 12 made of Ta is exposed, whereupon polishing is stopped.

An example of FIG. 4 indicates the characteristics when a pressure on the barrier film 12 was set at 3 Psi. As is clear from FIG. 4, with a decreasing concentration of hydrogen peroxide, the polishing rate of Ta increases but that of Cu decreases. The polishing liquid contains hydrogen peroxide as well as such components as citric acid (a type of carboxylic acid as organic acid), silica abrasive grain, BTA (Benzo-Tri-Azole: anti-oxidant), water, and a like. When a polishing liquid to which hydrogen peroxide is thus added as an oxidizing agent is used, the added quantity (concentration) of hydrogen peroxide has a dominant effect on the polishing rate, so that by increasing the concentration of hydrogen peroxide in the liquid, the polishing rate of the Cu film 14 can be made larger than that of the barrier film 12. Note here that the polishing rate of the Cu film 14 needs to be at least about 800 Å/min in the first polishing step. In the first polishing step, therefore, hydrogen peroxide is added by 1.5 weight-percent or more to the polishing liquid employed.

Figure 3:
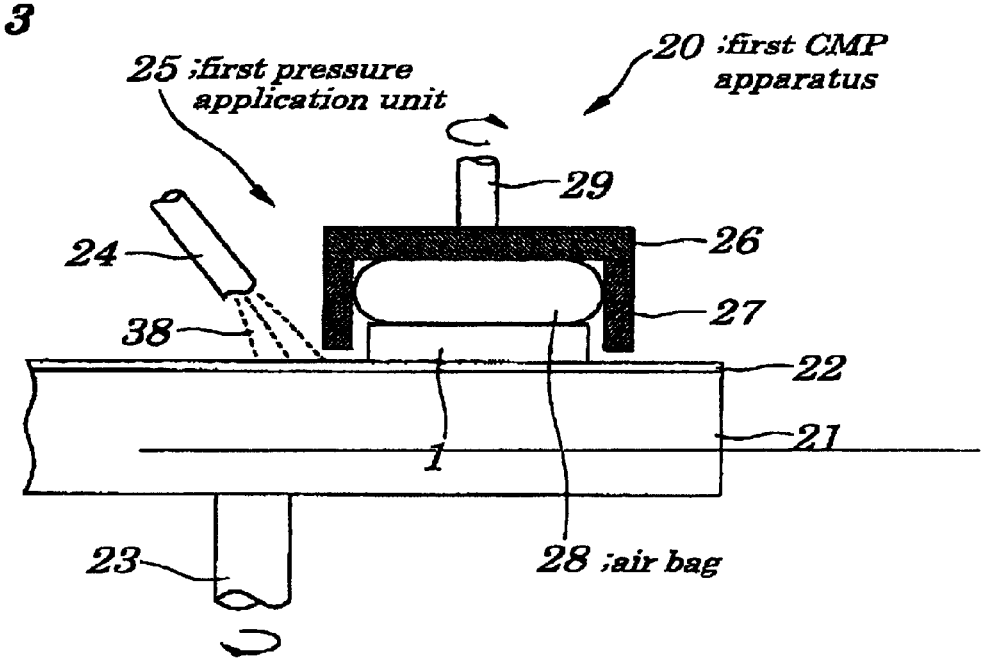
FIG. 3 is a cross-sectional view for outlining a configuration of a CMP apparatus used in the semiconductor device manufacturing method according to the first embodiment.

In FIG. 3, a first CMP apparatus 20 is provided with an abrasive surface plate 21 which is mounted with an abrasive pad 22 thereon, in such a configuration that the surface of the Cu film 14, which constitutes the surface of the semiconductor substrate 1 to be polished, comes in contact with this abrasive pad 22 so that in this state the abrasive surface plate 21 may be driven in rotation by a rotary shaft 23. From a nozzle 24 is supplied a polishing liquid 38 which is prepared so as to give a higher polishing rate of the Cu film 14 than that of the barrier film 12 as mentioned above.

Above the abrasive surface plate 21, on the other hand, a first pressure application unit 25 is provided for holding and pressing the semiconductor substrate 1 when it is polished, in such a configuration that the back side of the semiconductor substrate 1 is pressed by an air bag 28 enclosed in a space formed by a metal head 26 and a retainer 27 so that in this state the first pressure application unit 25 may be driven in rotation by a rotary shaft 29. The air bag 28 serves as an elastic body having large elastic deformation to press the semiconductor substrate 1 from its back side against the abrasive pad 22 of the abrasive surface plate 21.

Figure 1F:
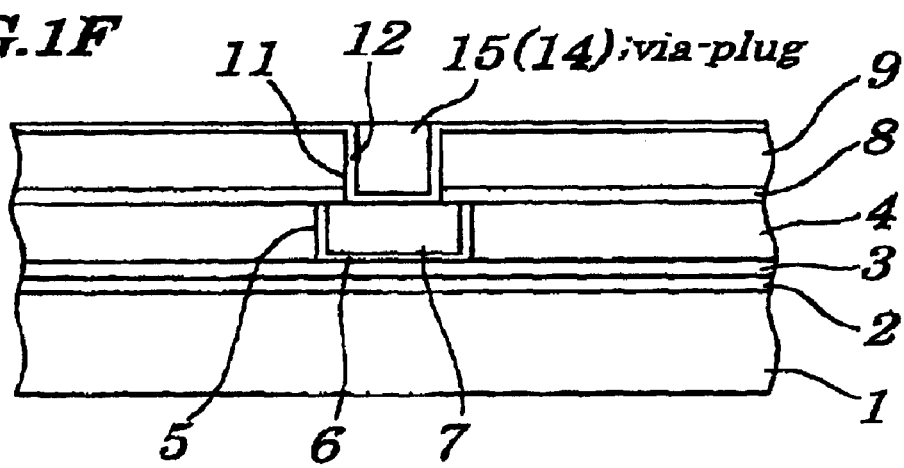

Next, as shown in FIG. 1F, to form a via-plug 15 in the second inter-layer insulating film 9, first an unnecessary part of the barrier film 12 exposed on the second inter-layer insulating film 9 is removed by CMP (second polishing step). This second polishing step is carrier out under such CMP conditions that the barrier film 12 may have a higher polishing rate than the Cu film 14 opposite to the first polishing step.

Specifically, in the second polishing step, a polishing liquid having such characteristics as shown in FIG. 4 is employed, to which is added particularly hydrogen peroxide as much as 0.09–1.5 weight-percent. As mentioned above, when a polishing liquid to which hydrogen peroxide is thus added as an oxidizing agent is used, the added quantity (concentration) of hydrogen peroxide has a dominant effect on the polishing rate, so that by decreasing the concentration of hydrogen peroxide in the liquid, the polishing rate of the barrier film 12 can be made larger than that of the Cu film 14. Note here that the polishing rate of the barrier film 12 needs to be at least about 500 Å/min in the second polishing step. In the second polishing step, therefore, hydrogen peroxide is added by 0.09–1.5 weight-percent to the polishing liquid employed as mentioned above. That is, it is difficult to add hydrogen peroxide by less than 0.09 weight-percent with good controllability and so is added by 0.09–1.5 weight-percent to the polishing liquid employed.

Also, in this second polishing step, CMP is carried out with a pressure of 4–10 Psi applied on the barrier film 12 on the second inter-layer insulating film 9. By thus applying a pressure in a specific range on the barrier film 12 during CMP thereof, it can have a higher polishing rate sensitively than the Cu film 14 to thereby eliminate a problem of the barrier film 12 being left non-removed at the peripheral portions of the semiconductor substrate 1 which have a large step, thus improving the surface uniformity. Since the barrier film 12 can thus be removed completely, even when any other insulating film such as an etching stopper film 8, for example, is formed on the second inter-layer insulating film 9 in post-processing, the close contact therebetween is not deteriorated, thus preventing easy peel-off of the film.

Figure 5:
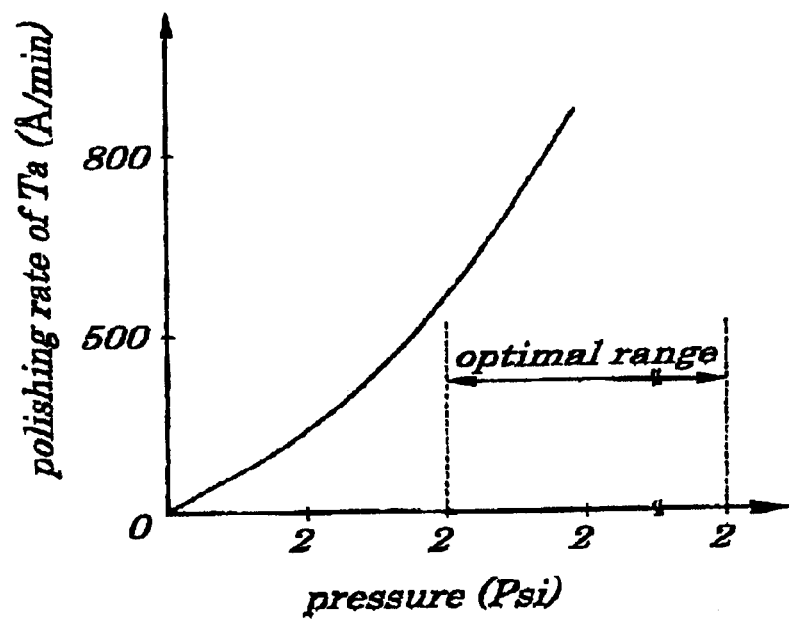
FIG. 5 is a graph for showing a relationship between a pressure applied on a barrier film (horizontal axis) and the Ta polishing rate (vertical axis) in the semiconductor device manufacturing method according to the first embodiment.

An example of FIG. 5 indicates the characteristics when the concentration of hydrogen peroxide is set at 1.5 weight-percent. As is clear from FIG. 5, with the increasing pressure applied, the polishing rate of Ta increases. If the pressure exceeds about 10 Psi, however, the polishing rate of Ta becomes excessive and so may damage the Cu wiring and change the film thickness to resultantly give rise to, for example, a problem of fluctuations in wiring resistance, to guard against which, therefore, preferably CMP is carried out with a pressure of 4–10 Psi (in an optimal range) as applied on the barrier film 12 on the second interlayer insulating film 9 as mentioned above.

Figure 6:
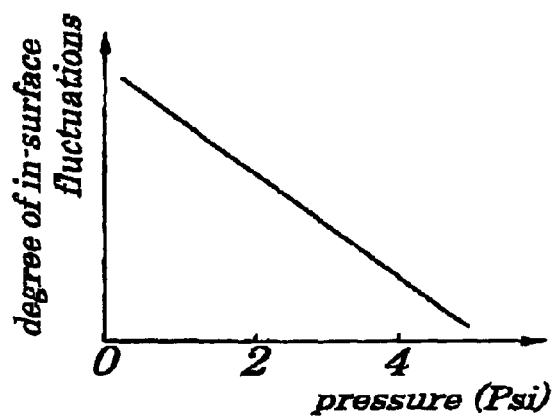
FIG. 6 is a graph for showing a relationship between the pressure applied on the barrier film (horizontal axis) and an in-surface fluctuation degree (vertical axis) in the semiconductor device manufacturing method according to the first embodiment.

An example of FIG. 6 indicates the characteristics when the concentration of hydrogen peroxide added was set at 1.5 weight-percent. As is clear from FIG. 6, with the increasing pressure applied, the degree of in-surface fluctuations is decreased, to improve the surface uniformity. The actual pressure, however, is set at a range of 4–10 Psi as mentioned above, taking into account correlation with the characteristics of FIG. 5.

Also, by applying a pressure in a specific range on the barrier film 12 in CMP thereof as mentioned above, the polishing rate thereof can be increased and correspondingly the time for which the polishing liquid is in contact with the surface of the Cu film 14 can be shortened, thus preventing the polishing liquid from being concentrated to the via-plug 15. This in turn avoid easy formation of a recess in the via-plug 15, thus preventing the occurrence of open-circuiting of a via-chain.

Figure 7:
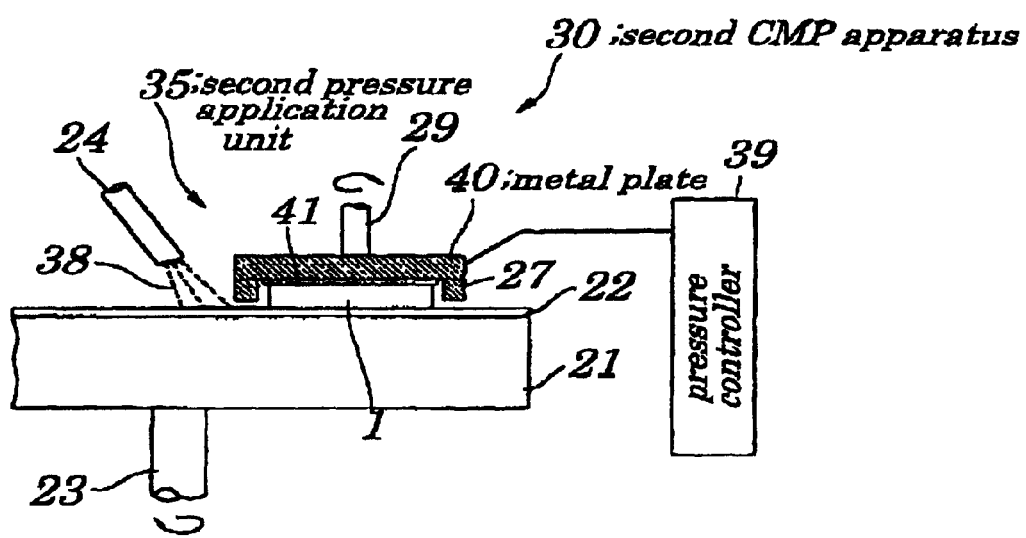
FIG. 7 is a cross-sectional view for outlining a configuration of another CMP apparatus used in the semiconductor device manufacturing method according to the first embodiment.

In FIG. 7, above the abrasive surface plate 21, a second CMP apparatus 30 is provided with a second pressure application unit 35 for holding and pressing the semiconductor substrate 1 when it is polished, in such a configuration that a metal plate 40 serving as an elastic body having small elastic deformation presses the semiconductor substrate 1 from its back side against the abrasive pad 22 of the abrasive surface plate 21 via a film carrier 41. In this configuration, from the nozzle 24 is supplied the polishing liquid 38 to which hydrogen peroxide is added by 0.09–1.5 weight-percent as mentioned above. Also, the second pressure application unit 35 is controlled in configuration by a pressure controller 39 so that it may apply a pressure of 4–10 Psi on the barrier film 12 on the semiconductor substrate 1 as mentioned above.

Note here that the same or similar components in FIGS. 7 and 3 are indicated by the same reference numerals and their explanation is omitted.

By thus performing the second polishing step, as shown in FIG. 1F, the Cu film 14 is left non-removed only in the via-hole 11 via the barrier film 12, thus forming the via-plug 15.

Figure 2:
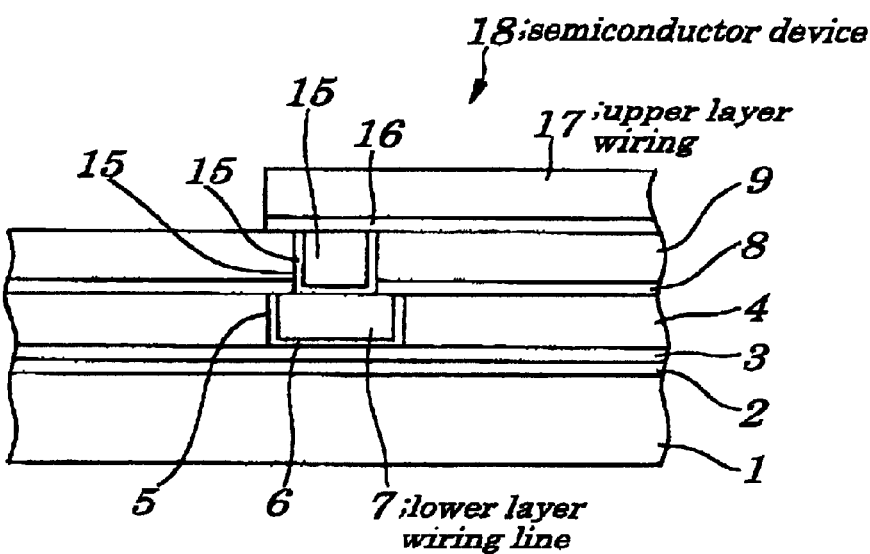
FIG. 2 is a cross-sectional view for showing a semiconductor device manufactured by the semiconductor device manufacturing method according to the first embodiment.

Next, an upper layer wiring 17 made of a Cu film is formed via a barrier film 16 on the second inter-layer insulating film 9, thus completing a semiconductor device 18 having such a multi-layer wiring construction as shown in FIG. 2.

Thus, by the semiconductor device manufacturing method of this embodiment, to form in the second inter-layer insulating film 9 the via-plug 15 for interconnecting the lower layer wiring 7 and the upper layer wiring 17, the via-hole 11 is formed in the second inter-layer insulating film 9 covering the lower layer wiring 7, throughout the surface of which are formed the barrier film 12 made of Ta and the Cu film 14 sequentially; then, first the unnecessary part of the Cu film 14 is removed by the CMP method using a polishing liquid 38 to which hydrogen peroxide is added by 1.5 weight-percent or more (first polishing step) and then another polishing liquid 38 to which hydrogen peroxide is added by 0.09–1.5 weight-percent is used to remove the unnecessary part of the barrier film 12 under such CMP conditions that a pressure of 4–10 Psi may be applied on the barrier film 12 (second polishing step), thus easily forming the via-plug 15.

As can be seen from the above, when forming a via-plug for interconnecting upper layer and lower layer wirings via a barrier film on an inter-layer insulating film using a CMP method, the polishing rate of the barrier film can be increased to improve throughput as well as surface uniformity and also prevent occurrence of a problem of via-chain open-circuiting of the via-plugs.

SECOND EMBODIMENT

The semiconductor device manufacturing method of the second embodiment differs in configuration greatly from that of the above-mentioned first embodiment in that the second polishing step of the first embodiment is replaced by a CMP method using a polishing liquid containing no hydrogen peroxide.

In this embodiment, the second polishing step of FIG. 1F according to the first embodiment is replaced by a second polishing step that satisfies the CMP conditions that a barrier film 12 may have a higher polishing rate than a Cu film 14.

As shown in FIG. 4, even with a polishing liquid 38 having a concentration of hydrogen peroxide contained therein being 0%, that is, having no hydrogen peroxide added thereto, it is possible to obtain a polishing rate of the barrier film 12 of about 1000 Å/min in excess of about 500 Å/min, which is required in the second polishing step. In this embodiment, therefore, the polishing liquid having the concentration of hydrogen peroxide contained therein being 0% is used in the second polishing step The composition of the polishing liquid in this case is as follows:

Citric acid (organic acid): 0.01–1.0 weight-percent

Silica abrasive grain: 1.0–10 weight-percent

BTA (Benzo-Tri-Azole: anti-oxidant): 0.01–1.0 weight-percent

Water: the remainder

The steps which follow this second polishing step are performed almost the same way as the first embodiment.

Thus, this embodiment will give almost the same effects as the first embodiment.

THIRD EMBODIMENT

The semiconductor device manufacturing method of the third embodiment differs in configuration greatly from that of the above-mentioned first embodiment in that an embedded wiring is formed in place of a via-plug in an insulating film.

The following will describe the semiconductor device manufacturing method according to this embodiment along the steps thereof with reference to FIGS. 8A–8E.

Figure 8A:
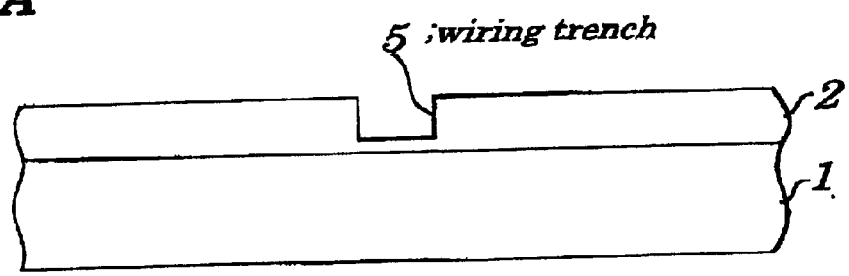
FIGS. 8A to 8C are process diagrams for sequentially showing steps of the semiconductor device manufacturing method according to a third embodiment of the present invention.

First, as shown in FIG. 8A, throughout a surface of a semiconductor substrate 1 made of silicon or a like is formed an insulating film 2 made of silicon oxide or a like to a film thickness of 1.0–3.0 μm. Then, a known photolithographic method is utilized to form in the insulating film 2 a wiring trench 5 having a depth of 0.2–2.5 μm and a width of 0.15–100 μm.

Figure 8B:
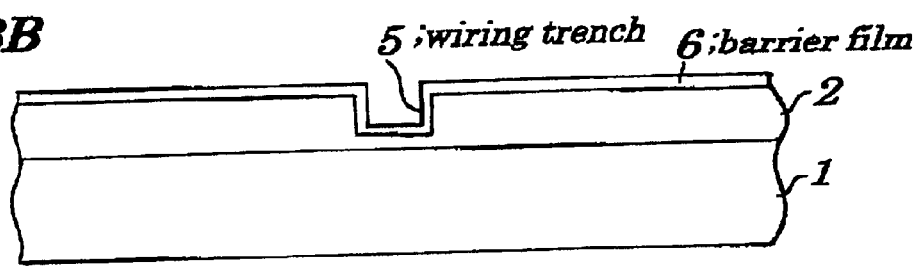
Figure 8C:
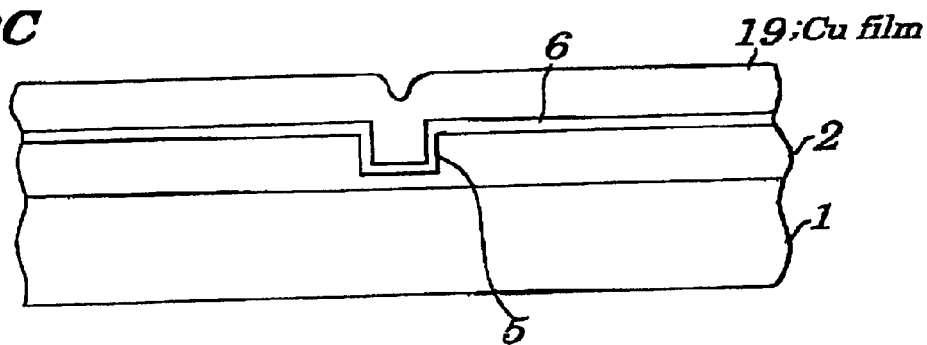

Next, as shown in FIG. 8B, by sputtering, throughout the surface including the wiring trench 5 is formed a barrier film 6 made of Ta to a film thickness of, for example, 10–80 nm. Then, as shown in FIG. 8C, by plating, throughout the surface of the barrier film 6 is formed a Cu film 19 to a film thickness of 0.5–3.0 μm.

Figure 8D:
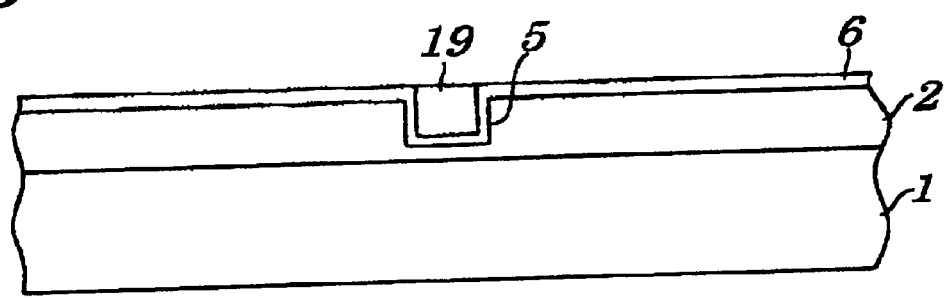
FIGS. 8D to 8E are process diagrams for sequentially showing the continuing steps of the semiconductor device manufacturing method according to the second embodiment.
Figure 8E:
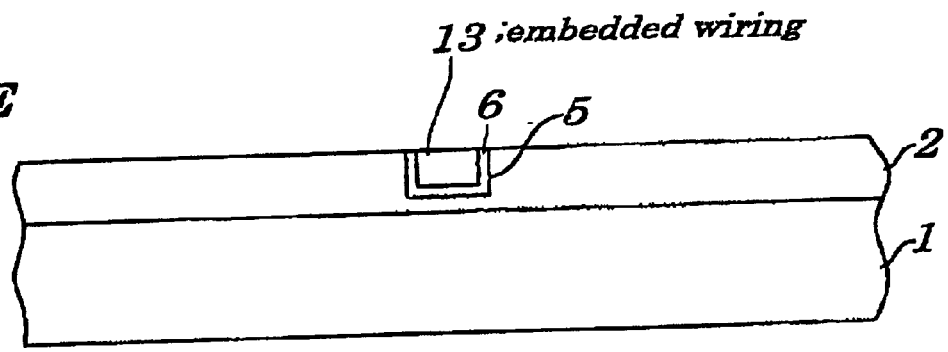
Figure 9:
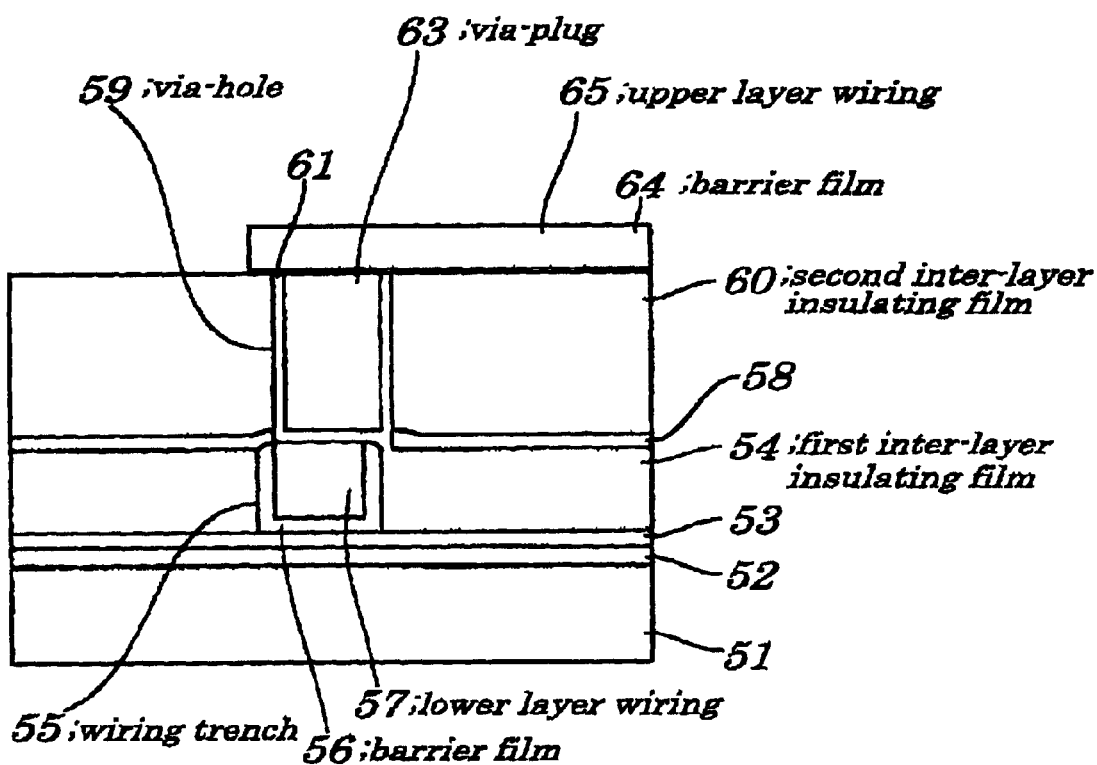
FIG. 9 is a cross-sectional view for showing a conventional semiconductor device.
Figure 10D:
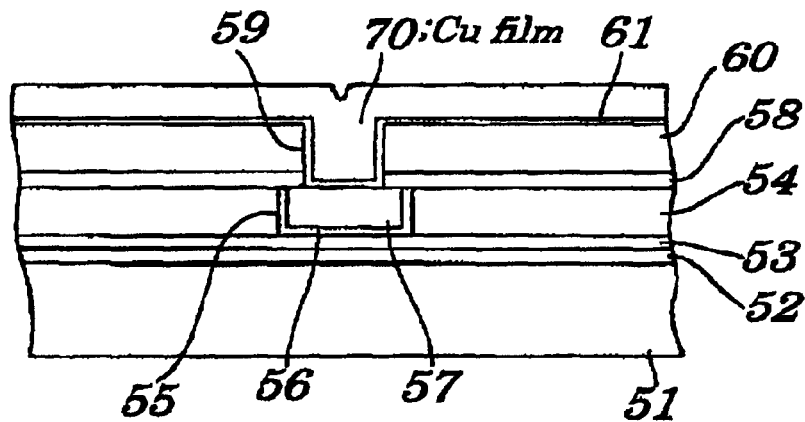
FIGS. 10D to 10F are process diagrams for sequentially showing the continuing steps of the method for manufacturing the conventional semiconductor device.
Figure 10E:
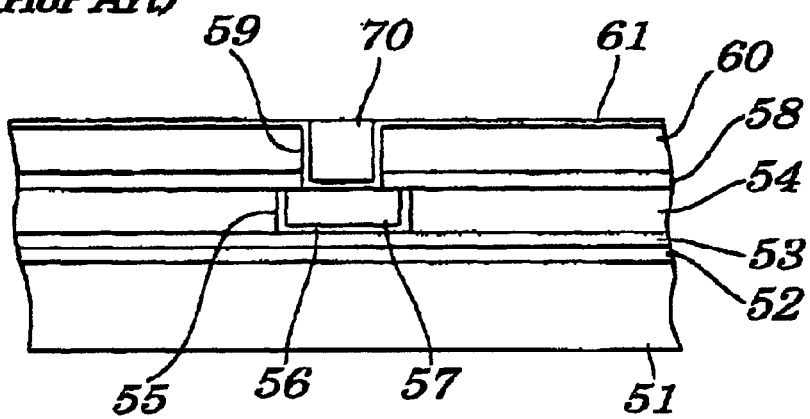
Figure 10F:
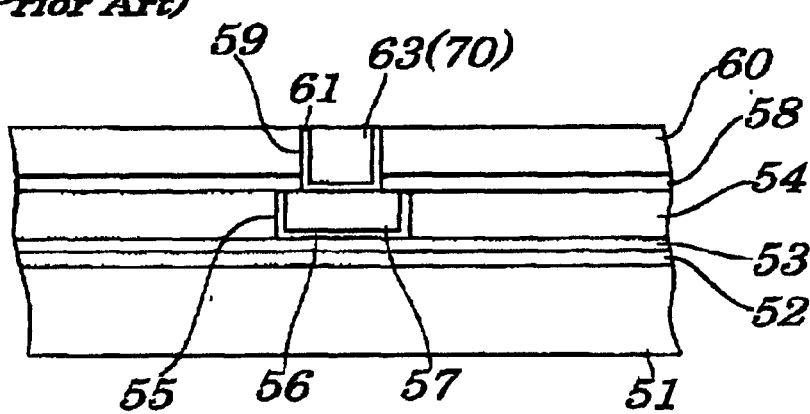
Figure 11:
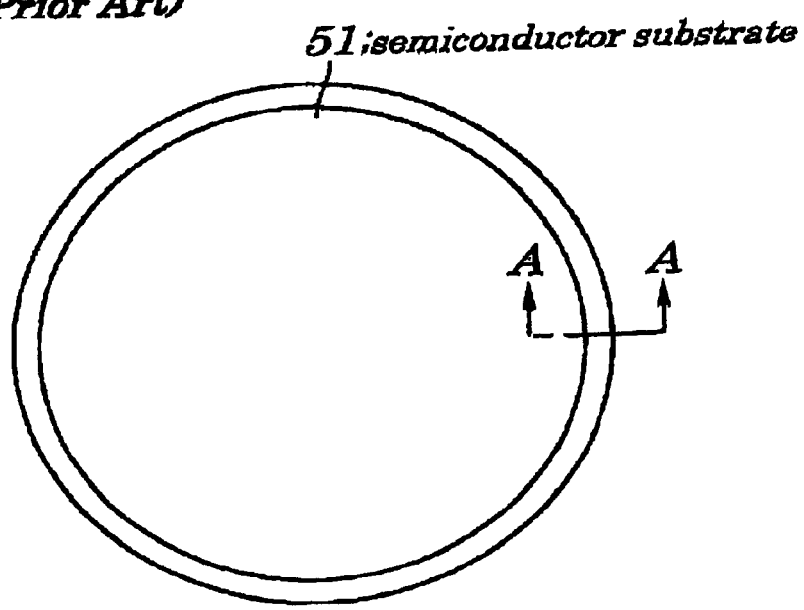
FIG. 11 is an illustration for showing a disadvantage of the conventional semiconductor device.
Figure 12:
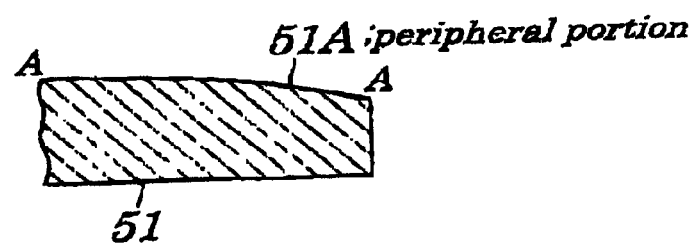
FIG. 12 is a cross-sectional view taken along line A—A of FIG. 11.
Figure 13A:
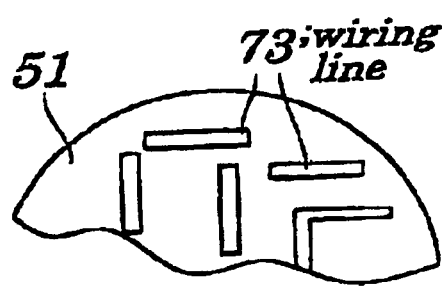
FIGS. 13A and 13B are other illustrations for showing the disadvantage of the conventional semiconductor device.
Figure 13B:
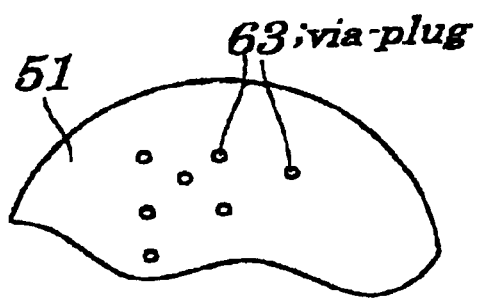
Figure 14:
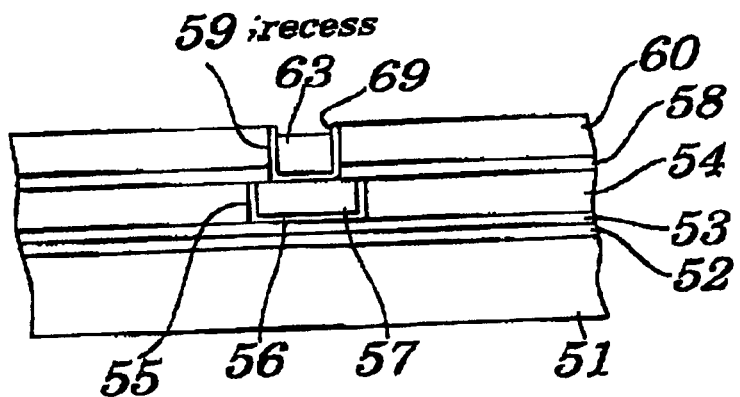
FIG. 14 is still another illustration for showing the disadvantage of the conventional semiconductor device.

Next, as shown in FIG. 8D, under almost the same conditions as those of the first polishing step in the first embodiment, the Cu film 19 exposed above the surface of the wiring trench 5 is polished by the CMP method. Then, as shown in FIG. 8E, under almost the same conditions as those of the second polishing step in the first embodiment, the barrier film 6 exposed above the surface of the wiring trench 5 is polished by the CMP method to form an embedded wiring 13.

Thus, this embodiment can also give almost the same effects as those by the first embodiment because a via-plug 15 employed in the first embodiment is just replaced by the embedded wiring 13.

It is apparent that the present invention is not limited to the above embodiments but may be changed and modified without departing from the scope and spirit of the invention. For example, although the above has exemplified use of a Cu film as the conductive material of the via-plug for interconnecting the lower layer and upper layer wirings, the Cu film may be replaced by an alloy of Cu and Al, Cu and Ag (silver), Cu, Al, and Si, or a like. Also, although the above has exemplified use of a Ta film as the barrier film, the Ta film may be replaced by a TaN (tantalum nitride) film, a stack of Ta and TaN films, or a like. Also, the barrier film may be made not only of Ta-based metal but also of such N-based metals as tungsten nitride (WN), tungsten silicon nitride (WSiN), and tantalum silicon nitride (TaSiN).

Also, the first and second inter-layer insulating films may be made not only of silicon oxide but also of silicon nitride, BSG (Boron-Silicate Glass), PSG (Phospho-Silicate Glass), BPSG (Boro-Phospho-Silicate Glass), or a like. Also, the etching stopper film may be made not only of silicon nitride but also of SiC (Silicon Carbonate), SiCN (Silicon Carbonate Nitride), or a like Also, although the above has described one example of the CMP apparatus used for the first and second polishing steps by use of CMP, any other CMP apparatus may be used. For example, a common CMP apparatus may be used for both the first and second polishing steps. Also, the conditions just exemplified above for the insulating films, film thickness, forming means, or a like may be changed corresponding to the purposes, applications, or a like.

What is claimed is:

1. A method of manufacturing a semiconductor device comprising:

forming a lower layer wiring;

forming an inter-layer insulating film to cover therewith said lower layer wiring;

a via-hole forming step for forming a via-hole in said inter-layer insulating film to expose said lower layer wiring at a bottom of said via-hole;

a barrier film forming step for forming a barrier film throughout a surface including said via-hole;

a conductive film forming step for forming a conductive film on said barrier film;

a first polishing step for polishing and removing said conductive film on said barrier film until said barrier film is exposed by a chemical mechanical polishing method using a first polishing liquid to achieve said conductive film having a higher polishing rate than said barrier film;

a second polishing step for removing said barrier film on said inter-layer insulating film by a chemical mechanical polishing method using a second polishing liquid to achieve said conductive film having a lower polishing rate than said barrier film, to leave said conductive film as non-removed only in said via-hole via said barrier film, thus forming a via-plug; and forming an upper layer wiring on said inter-layer insulating film after performing said second polishing step, thus single-damascene-interconnecting said lower layer wiring and said upper layer wiring through said via-plug.

2. The method of manufacturing a semiconductor device according to claim 1, wherein said second polishing step is performed with a pressure of 4–10 Psi (Pounds per square inch) applied on said barrier film on said inter-layer insulating film.

3. The method of manufacturing a semiconductor device according to claim 1, wherein said barrier film comprises tantalum-based metal and said conductive film comprises copper-based metal.

4. The method of manufacturing a semiconductor device according to claim 1, wherein said lower layer wiring and said upper layer wiring comprise respectively copper-based metal.

5. A method of manufacturing a semiconductor device comprising:

forming a lower layer wiring;

forming an inter-layer insulating film to cover therewith said lower layer wiring;

a via-hole forming step for forming a via-hole in said inter-layer insulating film to expose said lower layer wiring at a bottom of said via-hole;

a via-hole forming step for forming a via-hole in said inter-layer insulating film to expose said lower layer wiring at a bottom of said via-hole;

a barrier film forming step for forming a barrier film throughout a surface including said via-hole;

a conductive film forming step for forming a conductive film on said barrier film;

a first polishing step for polishing and removing said conductive film on said barrier film until said barrier film is exposed by a chemical mechanical polishing method using a first polishing liquid to which hydrogen peroxide is added by 1.5 weight-percent or more;

a second polishing step for removing said barrier film on said inter-layer insulating film by a chemical mechanical polishing method using a second polishing liquid to which hydrogen peroxide is added by 0.09–1.5 weight-percent, to leave said conductive film as non-removed only in said via-hole via said barrier film, thus forming a via-plug, wherein said second polishing liquid has concentration of hydrogen peroxide that is lower than concentration of hydrogen peroxide contained in said first polishing liquid; and forming an upper layer wiring on said inter-layer insulating film after performing said second polishing step, thus single-damascene-interconnecting said lower layer wiring and said upper layer wiring through said via-plug.

6. The method of manufacturing a semiconductor device according to claim 5, wherein said second polishing step is performed with a pressure of 4–10 Psi applied on said barrier film on said inter-layer insulating film.

7. The method of manufacturing a semiconductor device according to claim 5, where said barrier film comprises tantalum-based metal and said conductive film comprises copper-based metal.

8. The method of manufacturing a semiconductor device according to claim 5, wherein said lower layer wiring and said upper layer wiring comprise respectively copper-based metal.

9. A method of manufacturing a semiconductor device comprising:

forming a lower layer wiring;

forming an inter-layer insulating film to cover therewith said lower layer wiring;

a via-hole forming step for forming a via-hole in said inter-layer insulating film to expose said lower layer wiring at a bottom of said via-hole;

a barrier film forming step for forming a barrier film throughout a surface including said via-hole;

a conductive film forming step for forming a conductive film on said barrier film;

a first polishing step for polishing and removing said conductive film on said barrier film until said barrier film is exposed by a chemical mechanical polishing method using a polishing liquid to which hydrogen peroxide is added by 1.5 weight-percent or more;

a second polishing step for removing said barrier film on said inter-layer insulating film by a chemical mechanical polishing method using a polishing liquid containing no hydrogen peroxide, to leave said conductive film as non-removed only in via-hole via said barrier film, thus forming a via-plug; and forming a upper wiring layer on said inter-layer insulating film, thus interconnecting said lower layer wiring and said upper layer wiring through said via-plug.

10. The method of manufacturing a semiconductor device according to claim 9, wherein said second polishing step is performed with a pressure of 4–10 Psi applied on said barrier film on said inter-layer insulating film.

11. The method of manufacturing a semiconductor device according to claim 9, wherein said step of forming said upper layer wiring on said inter-layer insulating film is performed after said second polishing step, thus single-damascene-interconnecting said lower layer wiring and said upper layer wiring through said via-plug.

12. The method of manufacturing a semiconductor device according to claim 9, where said barrier film comprises tantalum-based metal and said conductive film comprises copper-based metal.

13. The method of manufacturing a semiconductor device according to claim 9, wherein said lower layer wiring and said upper layer wiring comprise respectively copper-based metal.

* * * * *